United States Patent
Xu et al.

(10) Patent No.: US 7,333,695 B2
(45) Date of Patent: Feb. 19, 2008

(54) SINGULATED DIES IN A PARALLEL OPTICS MODULE

(75) Inventors: Lee L. Xu, Cupertino, CA (US); Darren S. Crews, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/474,575

(22) Filed: Jun. 22, 2006

(65) Prior Publication Data

US 2006/0245699 A1    Nov. 2, 2006

Related U.S. Application Data

(62) Division of application No. 11/244,579, filed on Oct. 6, 2005, now Pat. No. 7,095,914, which is a division of application No. 10/938,036, filed on Sep. 10, 2004, now Pat. No. 6,975,784.

(51) Int. Cl.
G02B 6/02    (2006.01)
G02B 6/12    (2006.01)

(52) U.S. Cl. .............................. 385/52; 385/14; 385/15

(58) Field of Classification Search ................. 385/52, 385/14, 15
See application file for complete search history.

(56) References Cited

U.S. PATENT DOCUMENTS

| | | | |
|---|---|---|---|
| 4,756,590 A | 7/1988 | Forrest et al. | |
| 5,912,913 A | 6/1999 | Kondow et al. | |
| 6,152,588 A | 11/2000 | Scifres | |
| 6,224,216 B1 * | 5/2001 | Parker et al. | 353/31 |
| 6,453,096 B1 * | 9/2002 | Kim et al. | 385/52 |
| 6,636,681 B2 | 10/2003 | Ji et al. | |
| 6,757,106 B2 * | 6/2004 | Kusuyama | 359/619 |
| 6,873,756 B2 * | 3/2005 | Beerling et al. | 385/18 |
| 2001/0030782 A1 | 10/2001 | Trezza | |
| 2002/0110323 A1 | 8/2002 | Kishima | |
| 2002/0191296 A1 * | 12/2002 | Kusuyama | 359/619 |
| 2003/0043582 A1 * | 3/2003 | Chan et al. | 362/259 |
| 2003/0048979 A1 * | 3/2003 | Beerling et al. | 385/18 |
| 2003/0053501 A1 * | 3/2003 | Sekiya | 372/43 |
| 2003/0086636 A1 | 5/2003 | Kang et al. | |

(Continued)

FOREIGN PATENT DOCUMENTS

EP    0 909 968 A1    4/1999

(Continued)

OTHER PUBLICATIONS

Emcore Corporation, "1 × 12 VCSEL Array 2.7-3.6 Gb/s, 8685-1016," Product Brief, Feb. 10, 2004, Albuquerque, New Mexico.

(Continued)

Primary Examiner—K. Cyrus Kianni
(74) Attorney, Agent, or Firm—Blakely, Sokoloff, Taylor & Zafman LLP

(57) ABSTRACT

A parallel optics module including singulated dies. A first singulated die includes a first semiconductor optical component, and a second die includes a second semiconductor optical component. The first and second dies are mounted to a substrate. The first and second dies to be integrated into a parallel optics module.

6 Claims, 6 Drawing Sheets

U.S. PATENT DOCUMENTS

| | | | |
|---|---|---|---|
| 2004/0022488 A1* | 2/2004 | Coleman | 385/33 |
| 2004/0061346 A1* | 4/2004 | Capewell | 294/64.1 |
| 2004/0091011 A1* | 5/2004 | Liu | 372/46 |
| 2004/0247236 A1* | 12/2004 | Yoshimura et al. | 385/16 |
| 2005/0180700 A1* | 8/2005 | Farr | 385/89 |
| 2006/0019504 A1* | 1/2006 | Taussig | 438/903 |

FOREIGN PATENT DOCUMENTS

| | | |
|---|---|---|
| EP | 1 022 869 A1 | 7/2000 |
| EP | 1 041 690 A1 | 10/2000 |
| JP | 08292345 | 11/1996 |
| JP | 09049948 | 2/1997 |

OTHER PUBLICATIONS

Walker, James K. et al., "Bringing a GRIN to the Network Infrastructure: Graded-Index Plastic Optical Fiber," Cabling Business Magazine, Dec. 2002, pp. 38-40.

Agilent Technologies, Inc., "Agilent HFBR-7924 and HFBR-7924E/H/HE Four-Channel Pluggable Parallel Fiber Optic Transceiver: Part of the Agilent METRAK family," Data Sheet, Dec. 8, 2003, pp. 1-17.

PCT/US2005/030413, PCT Int'l Search Report and Written Opinion, Dec. 2, 2005.

* cited by examiner

SINGULATED DIES IN A PARALLEL OPTICS MODULE

CROSS-REFERENCE TO RELATED APPLICATION

This application is a divisional of U.S. patent application Ser. No. 11/244,579, filed Oct. 6, 2005 now U.S. Pat. No. 7,095,914, which is a divisional of U.S. patent application Ser. No. 10/938,036, filed Sep. 10, 2004, now U.S. Pat. No. 6,975,784 B1, and claims the benefit therefrom under 35 U.S.C. § 120.

BACKGROUND

1. Field

Embodiments of the invention relate to the field of optical systems and more specifically, but not exclusively, to singulated dies in a parallel optics module.

2. Background Information

Optical systems are used today to move data and communications. Parallel optics involves using a number of optical channels over multiple optical fibers. Usually, each fiber carries a single optical channel. In a parallel optics system, a transmit module includes several transmitters that are connected to several optical fibers bundled in a fiber ribbon cable. A receiver module having several optical receivers is connected to the fiber ribbon cable to receive the optical signals.

In current parallel optics modules, an array of 12 Vertical Cavity Surface Emitting Lasers (VCSELs) may be formed on one die. The pitch between the VCSELs is usually 250 microns to match the pitch between a corresponding array of 12 glass optical fibers. Since the core of the glass optical fibers is typically 8 to 62.5 microns, the 250 micron pitch of the VCSELs necessitates an alignment accuracy of the VCSELs of approximately 3-5 microns using multimode glass optical fiber. Further, since the VCSELs are formed in an array on a single die, if a defect is discovered in one VCSEL, the entire die is usually discarded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
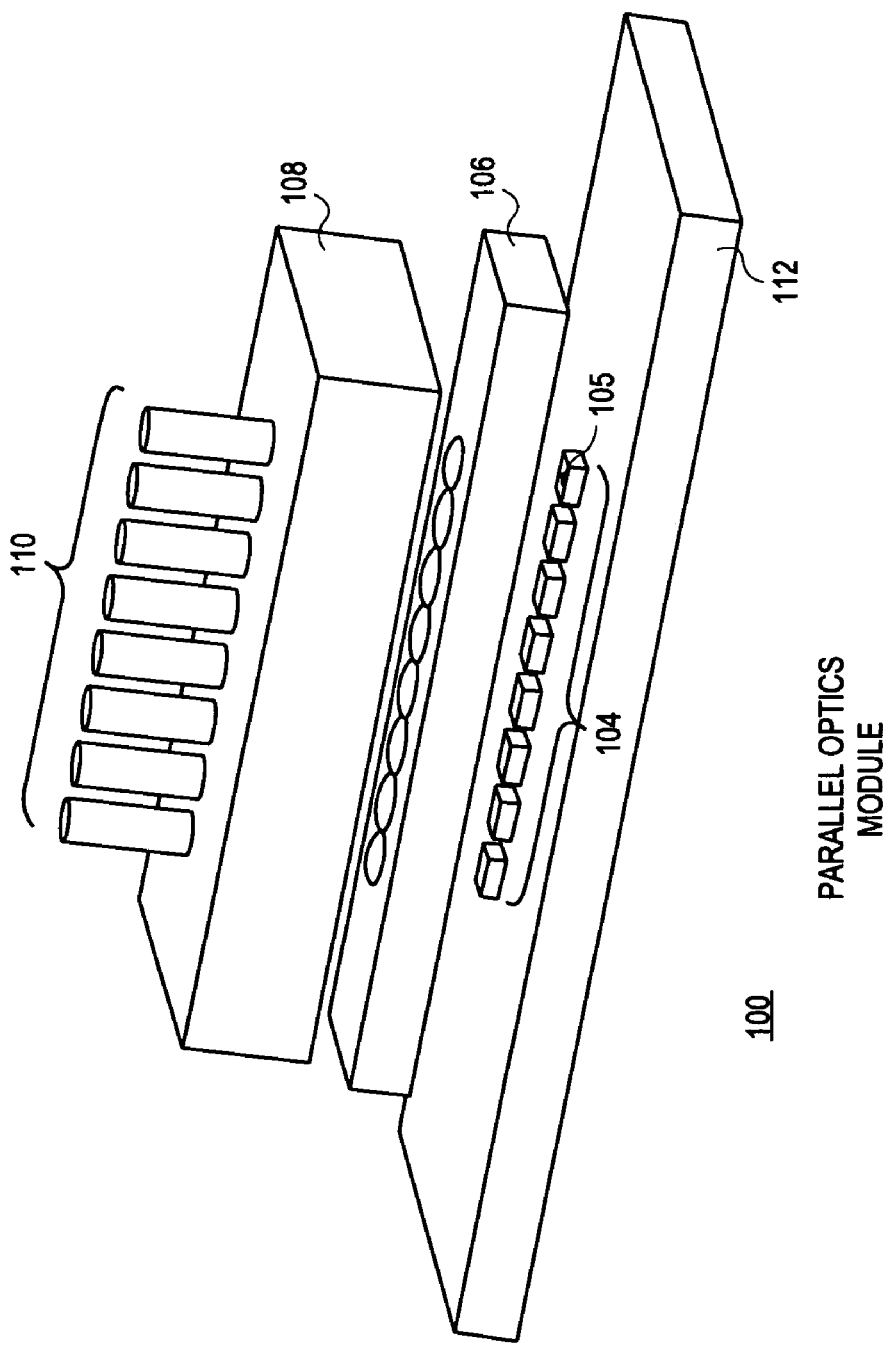
FIG. 1 is a diagram illustrating one embodiment of a parallel optics module in accordance with the teachings of the present invention.

Referring to FIG. 1, one embodiment of a parallel optics module 100 is shown. Parallel optics module 100 includes two or more singulated dies 104 coupled to a substrate 112. In one embodiment, dies 104 are attached to substrate 112 using well-known die attach methods.

Parallel optics module 100 includes an optical fiber array 108. Optical fiber array 108 includes two or more optical fibers 110. Optical fibers 110 include glass optical fibers, plastic optical fibers, and other light transmission medium. In one embodiment, the number of optical fibers 110 may correspond to the number of dies 104. For example, if there are four dies 104, then there may be four optical fibers 110. In another embodiment, the number of optical fibers 110 does not match the number of singulated dies 104, such as in a 4 channel transceiver connected to a 12 fiber ribbon cable.

Parallel optics module 100 may also include a lens 106. Lens 106 couples an optical signal transmitted or received by one or more dies 104 to a corresponding one or more optical fibers 110. In an alternative embodiment, optical signals transmitted or received by dies 104 are coupled to optical fibers 110 without lens 106.

Each singulated die 104 includes a single semiconductor optical component 105. In one embodiment, a singulated die includes semiconductor material such as, for example, Indium Phosphide (InP), Silicon Germanium (SiGe), Gallium Arsenide (GaAs), or the like. A single semiconductor optical component may be formed from the semiconductor material using well-known fabrication methods. In one embodiment, single semiconductor optical component 105 includes an optical transmitter, such as, for example, a VCSEL, a Fabry-Perot (FP) laser, a Distributed Feedback (DFB) laser, a Light Emitting Diode (LED), a Resonant Cavity Light Emitting Diode (RCLED), or the like. In another embodiment, single semiconductor optical component 105 includes an optical receiver, such as, for example, a photo intrinsic (PIN) diode, an Avalanche Photo Diode (APD), or the like.

In one embodiment, all singulated dies 104 include optical transmitters, such as, for example, in a 12-channel transmitter. While in another embodiment, all singulated dies 104 include optical receivers, such as, for example, in a 12-channel receiver. In yet another embodiment, singulated dies 104 include a combination of optical transmitters and optical receivers, such as, for example, in an 8-channel transceiver having 4 optical transmitters and 4 optical receivers. It will be understood that in a transceiver embodiment, the number of optical transmitters does not necessarily have to match the number of optical receivers.

Figure 2:
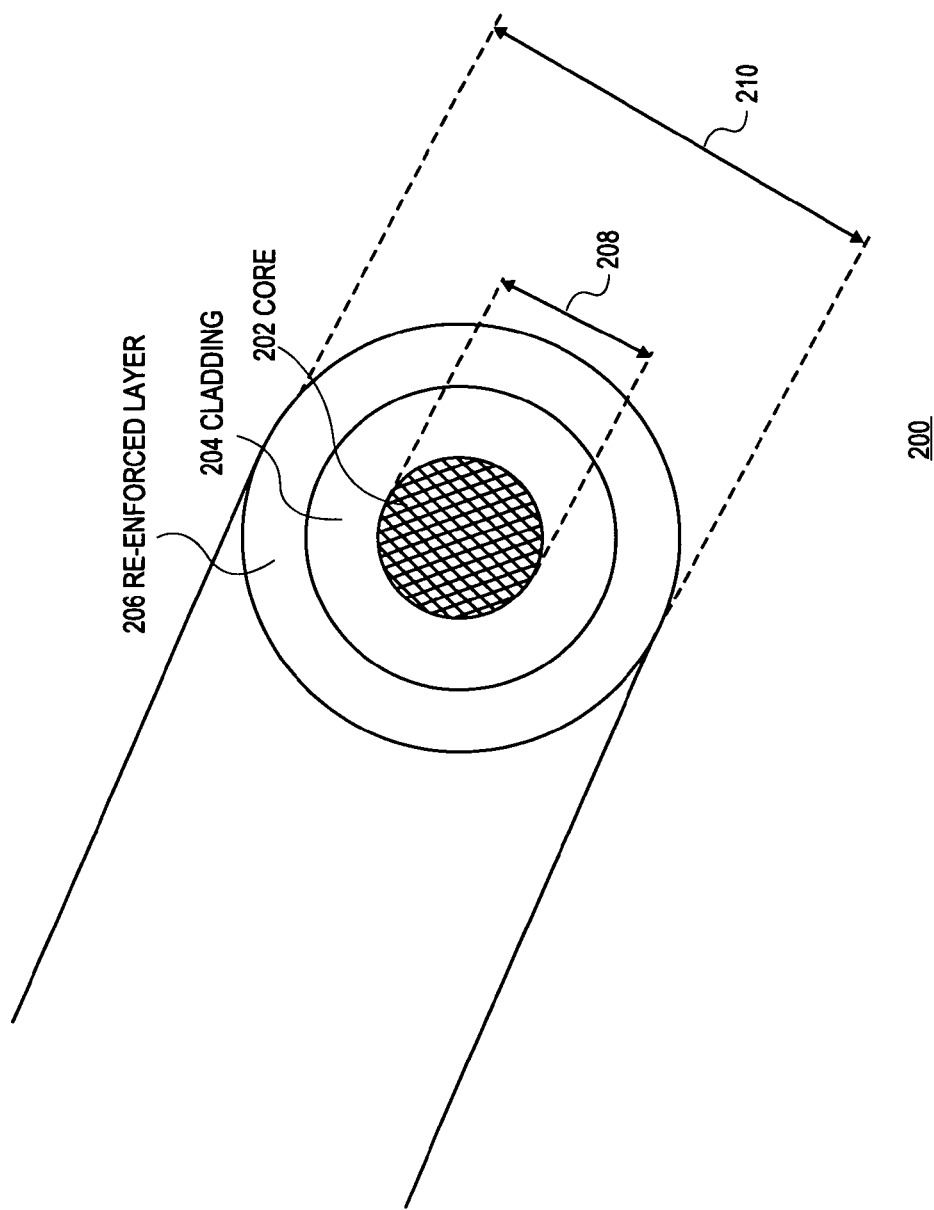
FIG. 2 is a diagram illustrating one embodiment of a plastic optical fiber in accordance with the teachings of the present invention.

Referring to FIG. 2, an embodiment of a plastic optical fiber 200 is shown. In one embodiment, plastic optical fiber 200 includes plastic optical fiber "Lucina" from the Asahi Glass Corporation. In another embodiment, plastic optical fiber 200 includes Plastic-Clad Silica (PCS) fiber. In an embodiment including a PCS fiber, the PCS fiber may have a core diameter of at least 100 microns.

Plastic optical fiber 200 includes a core 202 surrounded by a cladding 204. A re-enforced layer 206 surrounds cladding 204. In one embodiment, core 202 may have a diameter 208 of 100 to 1000 microns. In another embodiment, a diameter 210 of plastic optical fiber 200 may be 125 to 1000 microns.

In one embodiment, plastic optical fiber 200 includes a graded index fiber. In general, a graded index fiber is an optical fiber with a core having a refractive index that decreases as the distance from the center of the core increases. In another embodiment, plastic optical fiber 200 includes a step index fiber. In general, a step index fiber has a substantially uniform refractive index throughout the core and a sharp decrease in refractive index where the core meets the cladding. Plastic optical fiber 200 may include single mode fiber and multi-mode fiber.

Figure 3:
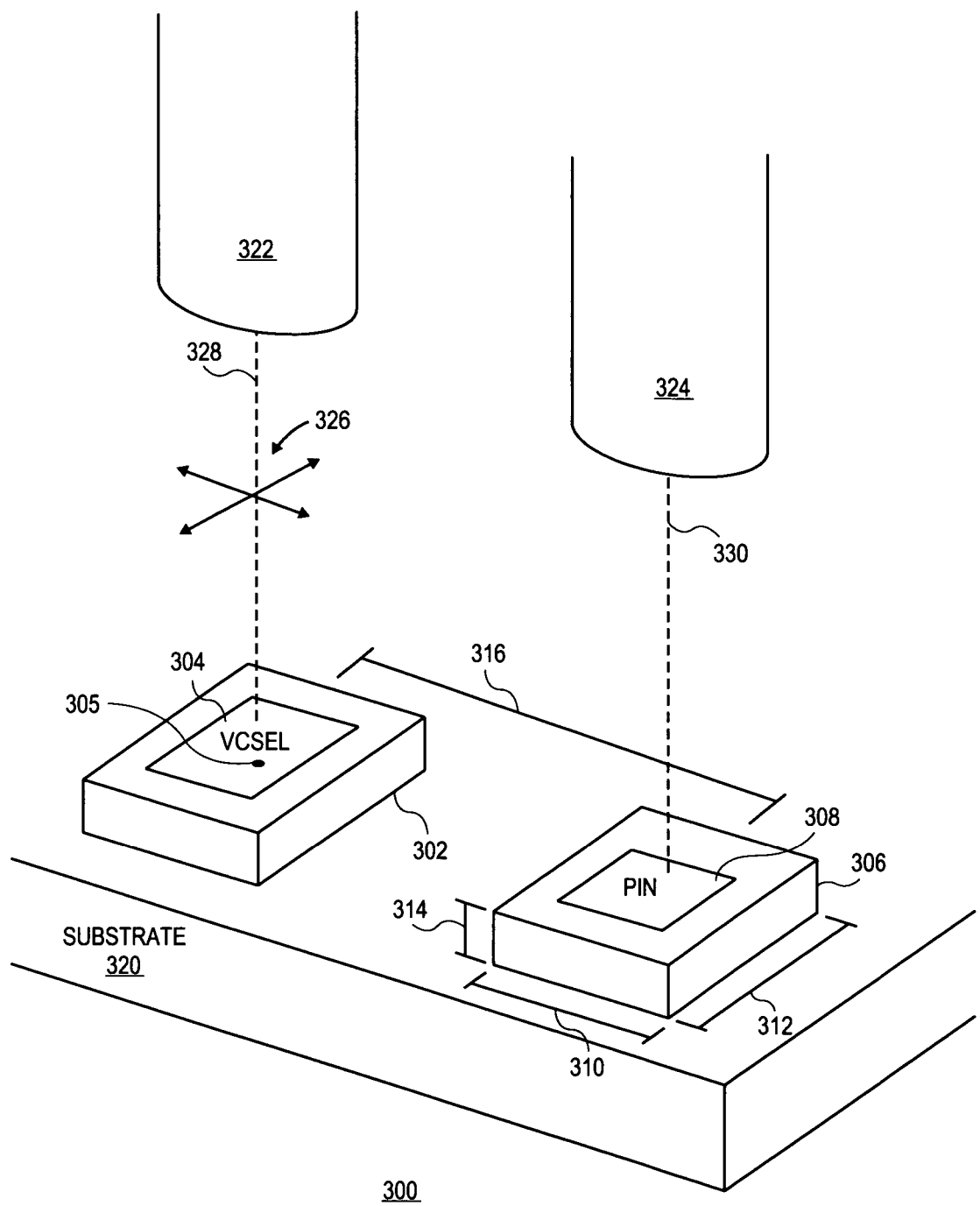
FIG. 3 is a diagram illustrating one embodiment of a parallel optics module in accordance with the teachings of the present invention.

Referring to FIG. 3, an embodiment of a parallel optics module 300 is shown. Parallel optics module 300 includes a singulated die 302 and a singulated die 306 mounted to a substrate 320. Singulated die 302 includes a VCSEL 304, and singulated die 306 includes a PIN diode 308. Electrical connections to VCSEL 304 and PIN diode 308 are not shown for clarity.

In one embodiment, singulated die 306 has a width 310 of approximately 300 microns, a length 312 of approximately 300 microns, and a height 314 of approximately 150 microns. In one embodiment, singulated dies 302 and 306 may have substantially similar dimensions; in another embodiment, singulated dies 302 and 306 may have different dimensions.

Parallel optics module 300 includes a plastic optical fiber 322 and a plastic optical fiber 324. Centerline 328 indicates the center of plastic optical fiber 322 (also known as the fiber axis). Centerline 330 corresponds to the center of plastic optical fiber 324. In an alternative embodiment, a lens may be positioned between singulated die 302 and plastic optical fiber 322, and between singulated die 306 and plastic optical fiber 324.

In one embodiment, the core sizes of the plastic optical fibers allows for alignment tolerances of the singulated dies above 5 microns. Alignment tolerance refers to the accuracy of attachment of a singulated die on a substrate. If a singulated die is placed outside of its alignment tolerances, then an acceptable amount of light may not pass between the optical fiber and the single semiconductor optical component of the singulated die. It will be understood that when a singulated die is out of alignment, light may still pass between the optical fiber and the single semiconductor device, but the loss of light may be outside of an acceptable level. The loss of light increases as the singulated die is further out of alignment. The more loss of light that is acceptable, the greater the alignment tolerance in attaching the singulated die to the substrate.

In the embodiment of FIG. 3, singulated die 302 has an alignment tolerance 326. In one embodiment, singulated die 302 is aligned using well-known die attachment techniques. Centerline 328 projected onto substrate 320 is the nominal alignment position of singulated die 302 on substrate 320. This nominal alignment position results in an alignment of a center 305 of VCSEL 304 with plastic optical fiber 322. In one embodiment, singulated die 302 has an alignment tolerance 326 of approximately 20 microns. Thus, in this particular embodiment, singulated die 302 may not be positioned more than 20 microns from its nominal position on substrate 320.

In another embodiment, the diameter of plastic optical fiber results in a distance between the fiber axis of adjacent fibers that eases the attachment of multiple singulated dies. In one embodiment, the distance between centerlines 328 and 330 may be approximately 500 microns or more. In this particular embodiment, a pitch 316 between singulated dies 302 and 306 may be approximately 500 microns or more. In other embodiments, pitch 316 may be less than 500 microns.

In yet another embodiment, the use of singulated dies may increase the yield of parallel optics modules. For example, if a singulated die fails to meet manufacturing specifications, then that singulated die may be discarded before it is attached to a substrate with other singulated dies. A passing singulated die may simply be used in place of the faulty singulated die. Thus, in one embodiment, all the singulated dies may be tested before being attached to a substrate.

Figure 4:
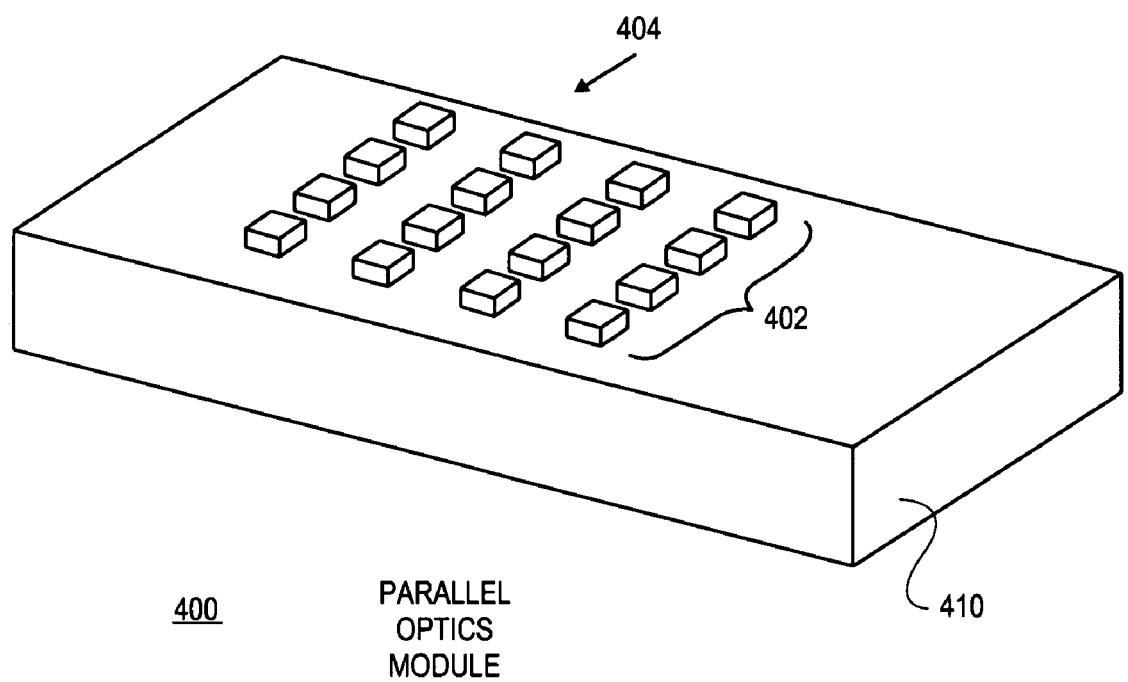
FIG. 4 is a diagram illustrating one embodiment of a parallel optics module in accordance with the teachings of the present invention.

Referring to FIG. 4, an embodiment of a parallel optics module 400 is shown. Parallel optics module 400 includes singulated dies 402 arranged in a two-dimensional array 404. The singulated dies 402 are coupled to a substrate 410. Parallel optics module 400 may include a corresponding two-dimensional array of optical fibers (not shown for clarity). It will be understood the two-dimensional array 404 is not limited to the arrangement shown in FIG. 4.

Figure 5:
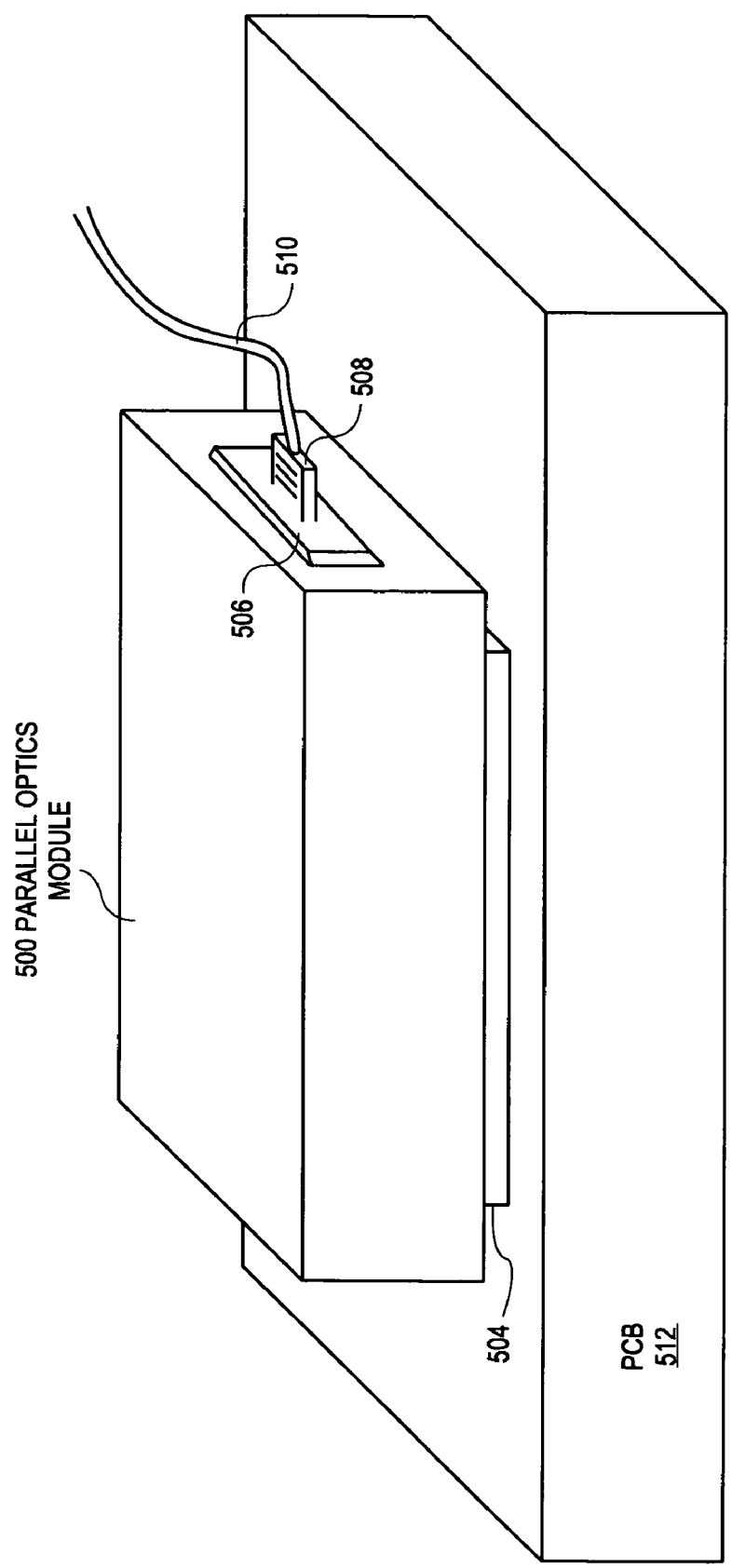
FIG. 5 is a diagram illustrating one embodiment of a parallel optics module in accordance with the teachings of the present invention.

Referring to FIG. 5, an embodiment of a parallel optics module 500 coupled to a printed circuit board (PCB) 512 is shown. Parallel optics module 500 includes singulated dies as described herein. Parallel optics module 500 may include an optical transmitter, an optical receiver, or an optical transceiver.

Parallel optics module 500 includes an electrical connector 504 to couple module 500 to PCB 512. Electrical connector 504 may include a ball grid array (BGA), a pluggable pin array, a surface mount connector, or the like.

Parallel optics module 500 may include an optical port 506. In one embodiment, optical port 506 may include an optical port to receive a Multi-Fiber Push On (MPO) connector 508. MPO connector 508 is coupled to an optical fiber ribbon 510. In one embodiment, the optical fiber ribbon 510 includes two or more plastic optical fibers.

In one embodiment, the singulated dies of parallel optics module 500 may emit light at different wavelengths for use in Wavelength Division Multiplexing (WDM). In one embodiment, parallel optics module 500 may transmit and/or receive optical signals at approximately 850 nanometers (nm). In another embodiment, parallel optics module 500 may operate with optical signals having a transmission data rate of approximately 3-4 Gigabits per second (Gb/s) per channel. In yet another embodiment, optical signals transmitted and received by parallel optics module 500 may travel up to a few hundred meters. It will be understood that embodiments of the invention are not limited to the optical signal characteristics described herein.

Figure 6:
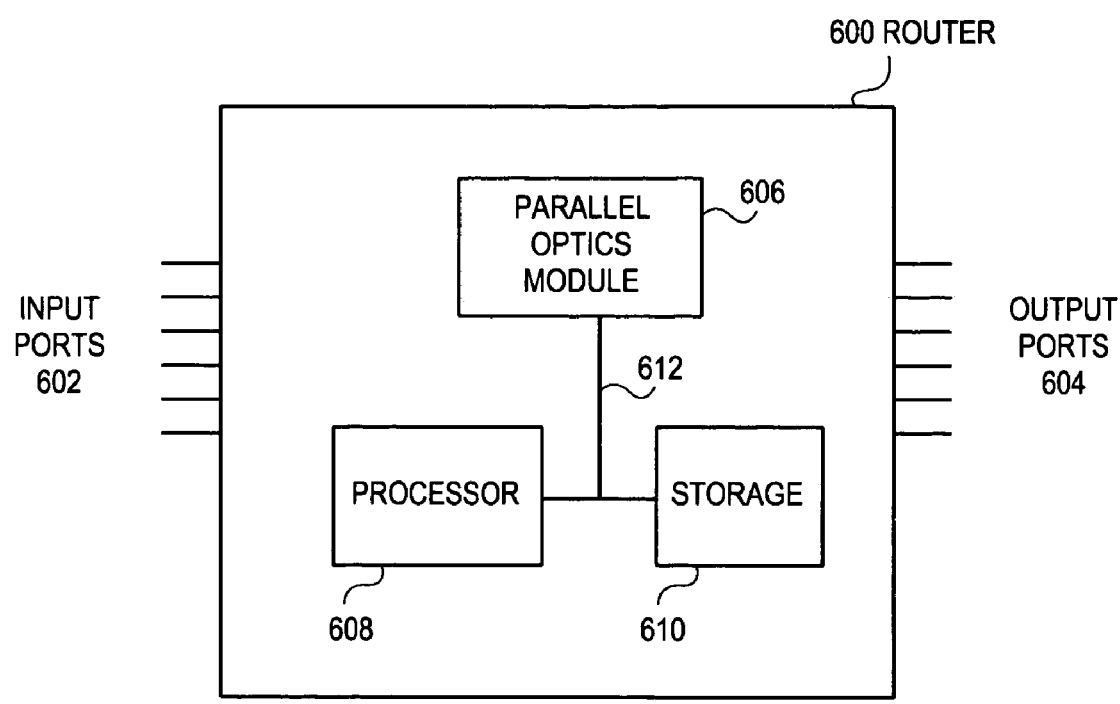
FIG. 6 is a diagram illustrating one embodiment of a router including a parallel optics module in accordance with the teachings of the present invention.

FIG. 6 illustrates an embodiment of a router 600. Router 600 includes a parallel optics module 606 included singulated dies as described herein. In another embodiment, router 600 may be a switch, or other similar network element. In an alternative embodiment, parallel optics module 606 may be used in a computer system, such as a server.

Parallel optics module 606 may be coupled to a processor 608 and storage 610 via a bus 612. In one embodiment, storage 610 has stored instructions executable by processor 608 to operate router 600.

Router 600 includes input ports 602 and output ports 604. In one embodiment, router 600 receives optical signals at input ports 602. The optical signals are converted to electrical signals by parallel optics module 606. Parallel optics module 606 may also convert electrical signals to optical signals and then the optical signals are sent from router 600 via output ports 604.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description.

The terms used in the following claims should not be construed to limit the invention to the specific embodiments disclosed in the specification. Rather, the following claims are to be construed in accordance with established doctrines of claim interpretation.

What is claimed is:

1. A system, comprising:
   a printed circuit board;
   a parallel optics module coupled to the printed circuit board, the parallel optics module including:
   a substrate;
   two or more dies attached to the substrate, wherein each die includes a single semiconductor optical component, wherein the two or more dies are attached to the substrate with an alignment tolerance between approximately 5 microns and approximately 20 microns; and
   two or more optical fibers corresponding to the two or more dies optically aligned with the two or more dies; wherein the parallel optics module operates with optical signals having a transmission data rate of approximately 3-4 Gigabits per second (Gb/s) per channel.

2. The system of claim 1 wherein the two or more optical fibers include at least one plastic optical fiber.

3. The system of claim 1 wherein the single semiconductor optical component includes one of an optical transmitter and an optical receiver.

4. The system of claim 1, further comprising an optical connector coupled to the parallel optics module, the optical connector coupled to a fiber optic ribbon.

5. The system of claim 1, further comprising:
   a processor communicatively coupled to the parallel optics module; and
   a storage component communicatively coupled to the parallel optics module.

6. The system of claim 1 wherein the system is one of a network element and a computer system.

* * * * *